US012364039B2

(12) United States Patent
Luan et al.

(10) Patent No.: US 12,364,039 B2
(45) Date of Patent: Jul. 15, 2025

(54) PHOTOSENSITIVE ASSEMBLY, CAMERA MODULE AND MANUFACTURING METHODS THEREFOR

(71) Applicant: NINGBO SUNNY OPOTECH CO., LTD., Zhejiang (CN)

(72) Inventors: Zhongyu Luan, Zhejiang (CN); Zhen Huang, Zhejiang (CN); Li Liu, Zhejiang (CN); Xinxiang Sun, Zhejiang (CN); Bin Lu, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 662 days.

(21) Appl. No.: 17/631,560

(22) PCT Filed: Jul. 2, 2020

(86) PCT No.: PCT/CN2020/099937
§ 371 (c)(1),
(2) Date: Jan. 31, 2022

(87) PCT Pub. No.: WO2021/017746
PCT Pub. Date: Feb. 4, 2021

(65) Prior Publication Data
US 2022/0278150 A1   Sep. 1, 2022

(30) Foreign Application Priority Data

Aug. 1, 2019   (CN) .......................... 201910709051.4
Aug. 1, 2019   (CN) .......................... 201921236646.4

(51) Int. Cl.
*H04N 23/54*   (2023.01)
*H04N 23/55*   (2023.01)
*H10F 39/00*   (2025.01)

(52) U.S. Cl.
CPC ........... *H10F 39/804* (2025.01); *H04N 23/54* (2023.01); *H04N 23/55* (2023.01); *H10F 39/024* (2025.01)

(58) Field of Classification Search
CPC ............................. H04N 23/54; H04N 23/55
(Continued)

(56) References Cited

U.S. PATENT DOCUMENTS

2005/0253211 A1 * 11/2005 Minamio ........ H01L 27/14683
257/432
2012/0068288 A1   3/2012 Hsin et al.
(Continued)

FOREIGN PATENT DOCUMENTS

CN   105721754   6/2016
CN   205545576   8/2016
(Continued)

OTHER PUBLICATIONS

International Search Report issued Oct. 13, 2020, in International (PCT) Application No. PCT/CN2020/099937, with English translation.
(Continued)

*Primary Examiner* — Anthony J Daniels
(74) *Attorney, Agent, or Firm* — Wenderoth, Lind & Ponack, L.L.P.

(57) ABSTRACT

The present application relates to a photosensitive assembly, a camera module and manufacturing methods therefor. The photosensitive assembly comprises a circuit board, a photosensitive chip electrically connected to the circuit board, at least one electronic component disposed on the circuit board, and a molded body integrally formed on the circuit board. The molded body has at least one slot formed therein in a recessed manner, and the slot is located outside the photosensitive chip. In this way, the magnitude of stress that
(Continued)

the molded body acts on the photosensitive chip is reduced by means of the slot being disposed in the molded body, so as to effectively reduce the amount of deformation of the photosensitive chip due to the stress.

14 Claims, 10 Drawing Sheets

(58) Field of Classification Search
USPC .......................................................... 348/374
See application file for complete search history.

(56) References Cited

U.S. PATENT DOCUMENTS

| | | | | |
|---|---|---|---|---|
| 2014/0346627 | A1* | 11/2014 | Yamada | H04N 23/57 |
| | | | | 257/431 |
| 2015/0000126 | A1 | 1/2015 | Yang et al. | |
| 2015/0138436 | A1* | 5/2015 | Wong | H01L 27/14683 |
| | | | | 348/374 |
| 2018/0035028 | A1* | 2/2018 | Wang | B29C 45/14336 |
| 2019/0041727 | A1 | 2/2019 | Wang et al. | |
| 2021/0233949 | A1* | 7/2021 | Chino | H01L 23/34 |

FOREIGN PATENT DOCUMENTS

| | | | | |
|---|---|---|---|---|
| CN | 107395938 | | 11/2017 | |
| CN | 108995144 | | 12/2018 | |
| CN | 109698894 | | 4/2019 | |
| CN | 109716745 | | 5/2019 | |
| CN | 208956146 | | 6/2019 | |
| CN | 210157258 | | 3/2020 | |
| EP | 4 224 876 | | 8/2023 | |
| JP | 2009-229611 | | 10/2009 | |
| JP | 2018018013 A | * | 2/2018 | ............. G02B 7/021 |
| WO | WO-2011078350 A1 | * | 6/2011 | ....... H01L 27/14618 |
| WO | 2018/028718 | | 2/2018 | |

OTHER PUBLICATIONS

Extended European Search Report dated Jun. 23, 2022 in European Patent Application No. 20846572.4.

* cited by examiner

PHOTOSENSITIVE ASSEMBLY, CAMERA MODULE AND MANUFACTURING METHODS THEREFOR

TECHNICAL FIELD

The present application relates to the field of camera modules, and in particular to a photosensitive assembly, a camera module and manufacturing methods therefor.

TECHNICAL BACKGROUND

In order to adapt to the development trend of miniaturization and thinning of electronic devices, the size of the camera module is gradually reduced. Correspondingly, the packaging process of the camera module has gradually evolved from the traditional Chip-on-Board (COB) process to the molding process.

FIG. 1 illustrates a schematic structural view of an existing camera module prepared based on a molding process. As shown in FIG. 1, the camera module is prepared through a Molding-on-Chip (MOC) molding process, and includes a photosensitive assembly and an optical lens 1P held in a photosensitive path of the photosensitive assembly. The photosensitive assembly includes a circuit board 2P, a photosensitive chip 3P, and a molded body 4P, wherein the molded body 4P is integrally formed on the circuit board 2P to integrally cover at least a part of the circuit board 2P and at least a part of the non-photosensitive area of the photosensitive chip 3P. However, the molding and packaging process has also caused some new technical problems. For example, the image quality is poor due to the deformation of the photosensitive chip caused by excessive stress.

Therefore, there is a need for an improved molding and packaging process and an improved structural solution for the camera module.

SUMMARY

A main objective of the present application is to provide a photosensitive assembly, a camera module and manufacturing methods therefor, which can effectively reduce the amount of bending of the photosensitive chip due to stress, so as to improve the imaging quality of the camera module.

Another objective of the present application is to provide a camera module, a photosensitive assembly and manufacturing methods therefor, wherein the magnitude of stress that the molded body acts on the photosensitive chip is reduced by means of the slot being disposed in the molded body, so as to effectively reduce the amount of deformation of the photosensitive chip due to the stress.

Another objective of the present application is to provide a camera module, a photosensitive assembly and manufacturing methods therefor, wherein the slot is formed in the molded body in a recessed manner, and the slot is formed at a position outside the photosensitive chip. In this way, the stress transmission chain formed by the molded body and the photosensitive chip is cut off, or the magnitude of the stress transmitted on the stress transmission chain formed by the molded body and the photosensitive chip is reduced.

Another objective of the present application is to provide a camera module, a photosensitive assembly and manufacturing methods therefor, wherein the slot divides the molded body into a first molded part and a second molded part. In this way, compared with the existing molding process, the volume of the molded part covering the photosensitive chip will be reduced, so that under the same shrinkage rate, the shrinkage of the molded part covering the photosensitive chip will be reduced. Therefore, the stress generated by the molded part is correspondingly reduced to reduce the bending amount of the photosensitive chip.

Another objective of the present application is to provide a camera module, a photosensitive assembly and manufacturing methods therefor, wherein the arrangement of the slot increases the overall exposed surface area of the molded body, so that the stress generated by the molded body can be relatively more distributed to the outer surface of the molded body, so as to relatively reduce the magnitude of the stress that the molded body acts on the photosensitive chip.

Another objective of the present application is to provide a camera module, a photosensitive assembly and manufacturing methods therefor, wherein the arrangement of the slot increases the overall exposed surface area of the molded body, which is advantageous to improve the heat dissipation performance of the photosensitive assembly.

Another objective of the present application is to provide a camera module, a photosensitive assembly and manufacturing methods therefor, wherein the slot provides a heat dissipation channel, and the heat generated during the operation of the photosensitive assembly can be dissipated through the heat dissipation channel.

Another objective of the present application is to provide a camera module, a photosensitive assembly and manufacturing methods therefor, wherein the slot can provide a glue overflow space to contain the overflowing glue when an optical lens is mounted on the photosensitive assembly and/or a filter element is mounted on a molded body or a filter element holder.

Another objective of the present application is to provide a camera module, a photosensitive assembly and manufacturing methods therefor, wherein, in an embodiment of the present application, a filter element holder is preset on the circuit board and integrally joined to a first molded part and a second molded part of the molded body after molding, and wherein the filter element holder can not only be used to mount a filter element, but also can prevent the stress generated by the second molded part from being transmitted to the photosensitive chip, and maintain the shape of the first molded part to ensure that the internal stress generated by the first molded part is insufficient to excessively change the shape of the photosensitive chip.

Through the following description, other advantages and features of the present application will become apparent, and can be realized by means and combinations particularly pointed out in the claims.

In order to achieve at least one objective or advantage described above, the present application provides a photosensitive assembly, comprising:
a circuit board;
a photosensitive chip electrically connected to the circuit board;
at least one electronic component disposed on the circuit board; and
a molded body integrally formed on the circuit board, wherein the molded body has at least one slot formed therein in a recessed manner, and the slot is located outside the photosensitive chip.

In the photosensitive assembly according to the present application, the molded body includes a first molded part and a second molded part divided by the slot, and the first molded part covers at least a part of the circuit board and at least a part of a non-photosensitive area of the photosensitive chip.

In the photosensitive assembly according to the present application, a depth of the slot is greater than or or equal to 30% of a height of the molded body.

In the photosensitive assembly according to the present application, the slot is formed in the molded body in a penetrating manner to expose a corresponding area of the circuit board.

In the photosensitive assembly according to the present application, the first molded part and the second molded part are connected through a molded channel.

In the photosensitive assembly according to the present application, the at least one slot includes a first slot and a second slot, and the first slot and the second slot are arranged symmetrically relative to a center line of the photosensitive chip, and wherein the molded channel is formed between the first slot and the second slot in a molding process.

In the photosensitive assembly according to the present application, the slot is a closed annular slot surrounding the first molded part to divide the molded body into the first molded part and the second molded part independent of each other.

In the photosensitive assembly according to the present application, the first molded part and the second molded part are formed through two molding processes.

In the photosensitive assembly according to the present application, the photosensitive assembly further comprises a filter element holder disposed in the slot, wherein the filter element holder is configured to mount a filter element thereon.

In the photosensitive assembly according to the present application, the photosensitive assembly further comprises a filter element holder disposed on the slot, wherein the filter element holder is configured to mount a filter element thereon.

In the photosensitive assembly according to the present application, the filter element holder has a channel penetrating therethrough, and wherein the filter element holder is preset on the circuit board and integrally joined to the first molded part and the second molded part of the molded body after the molded body is integrally molded.

In the photosensitive assembly according to the present application, the photosensitive assembly further comprises a side encapsulation that encloses a side part of the photosensitive chip.

In the photosensitive assembly according to the present application, the side encapsulation covers at least part of a lead for electrically connecting the photosensitive chip and the circuit board.

According to another aspect of the present application, the present application further provides a camera module, comprising:

an optical lens; and a photosensitive assembly as described above, wherein the optical lens is held in a photosensitive path of the photosensitive assembly.

According to another aspect of the present application, the present application further provides a method for manufacturing a photosensitive assembly, comprising steps of:

providing a circuit board, wherein at least one electronic component and at least one photosensitive chip are electrically connected to the circuit board;

receiving the circuit board in a molding space formed when an upper mold and an lower mold of a molding mold are clamped, wherein the molding mold includes a protrusion;

forming a molded body in the molding space; and separating the upper mold and the lower mold of the molding mold to form a slot recessed in the molded body at a position corresponding to the protrusion.

In the method of manufacturing the photosensitive assembly according to the present application, the process of forming the molded body comprises:

placing the circuit board in the lower mold of the molding mold;

the upper mold and the lower mold of the molding mold being clamped, wherein the upper mold includes a mold main body and first and second protrusions spaced apart and extending downward from the mold main body, wherein when the upper mold and the lower mold are clamped, the first protrusion of the upper mold abuts on the circuit board, and the second protrusion of the upper mold abuts on a non-photosensitive area of the photosensitive chip, so as to form a second molding space between the first protrusion and the mold main body, and to form a first molding space between the second protrusion and the first protrusion, and wherein the first protrusion further has a molded channel that communicates the first molding space and the second molding space;

filling a molding material into the first molding space and the second molding space, so as to form a first molded part in the first molding space and form a second molded part in the second molding space after the molding material is cured and molded, the first molded part and the second molded part being connected through the molded channel; and separating the upper mold and the lower mold to form the slot at a position corresponding to the first protrusion.

In the method of manufacturing the photosensitive assembly according to the present application, the process of forming the molded body comprises:

applying the compression molding material on the circuit board;

placing the circuit board in the lower mold of the molding mold;

the upper mold and the lower mold of the molding mold being clamped, wherein the upper mold includes a mold main body and a first protrusion spaced apart and extending downward from the mold main body, wherein when the upper mold and the lower mold are clamped, the first protrusion of the upper mold abuts on the circuit board, so as to form a first molding space between the first protrusion and the mold main body, and wherein the compression molding material is located in the first molding space;

forming a first molded part in the first molding space through a compression molding process;

separating the upper mold and the lower mold;

applying the compression molding material on the circuit board;

the lower mold and a second upper mold of the molding mold being clamped, wherein the second upper mold includes a second mold main body and a second protrusion spaced apart and extending downward from the second mold main body, wherein when the second upper mold and the lower mold are clamped, the second protrusion of the second upper mold abuts on the circuit board, so as to form a second molding space between the second protrusion and the second mold main body, and wherein the compression molding material is located in the second molding space;

forming a second molded part in the second molding space through a compression molding process; and separating the upper mold and the lower mold to form the slot recessed in the molded body at a position corresponding to the second protrusion.

In the method of manufacturing the photosensitive assembly according to the present application, before forming the molded body, the method further comprises:

presetting at least one filter element holder having a channel penetrating therethrough on the circuit board, so that the filter element holder is integrally joined to the first molded part and the second molded part of the molded body after the molded body is integrally molded.

In the method of manufacturing the photosensitive assembly according to the present application, the circuit board is implemented as a circuit board joint panel.

According to another aspect of the present application, the present application further provides a method for manufacturing a camera module, comprising:

forming a molded body according to the method for manufacturing the photosensitive assembly as described above, wherein the molded body has a slot formed therein in a recessed manner, and wherein the molded body is divided by the slot into a first molded part and a second molded part; and mounting an optical lens on the second molded part of the molded body.

Further objectives and advantages of the present application will be fully embodied through the understanding of the following description and the drawings.

These and other objectives, characteristics and advantages of the present application are fully embodied through the following detailed description, drawings and claims.

BRIEF DESCRIPTION OF THE DRAWINGS

The above and other objectives, features, and advantages of the present application will become more apparent from the detailed description of the embodiments of the present application taken in conjunction with the drawings. The drawings, which are used to provide a further understanding of the embodiments of the present application and constitute a part of the description, are used to explain the present application together with the embodiments of the present application, and do not constitute a limitation of the present application. In the drawings, the same reference signs generally represent the same components or steps.

DETAILED DESCRIPTION OF THE EMBODIMENTS

Hereinafter, exemplary embodiments according to the present application will be described to in detail with reference to the drawings. Obviously, the described embodiments are only a part of the embodiments of the present application, rather than all the embodiments of the present application. It should be understood that the present application is not limited by the exemplary embodiments described herein.

Overview of Application

As mentioned above, the camera module can be made smaller in size through a molding process such as Molding-on-Chip (MOC). However, the molding and packaging process has also caused some new technical problems.

Specifically, in the molded camera module, the joining of the circuit board 2P and the molded body 4P and the joining of the molded body 4P and the photosensitive chip 3P belong to rigid joining. The joining of the two has relatively high strength, and it needs to be disassembled through destructive methods. In contrast, the photosensitive chip 3P and the circuit board 2P are joined by glue, which belongs to flexible joining. Moreover, the thermal expansion coefficients of the circuit board 2P, the molded body 4P, and the photosensitive chip 3P are different. It should be known by those skilled in the art that in the molding process, since the environmental temperature changes greatly in the molding process (the temperature of molding material needs to be increased to 150 degrees or more during molding) and the frequency of change is high, the photosensitive chip 3P, the circuit board 2P and the molded body 4P have different degrees of expansion and contraction. Moreover, the expansion and contraction speeds of the circuit board 2P, the molded body 4P, and the photosensitive chip 3P are also inconsistent, and these phenomena ultimately result in the smallest shrinkage of the photosensitive chip 3P.

Figure 1:
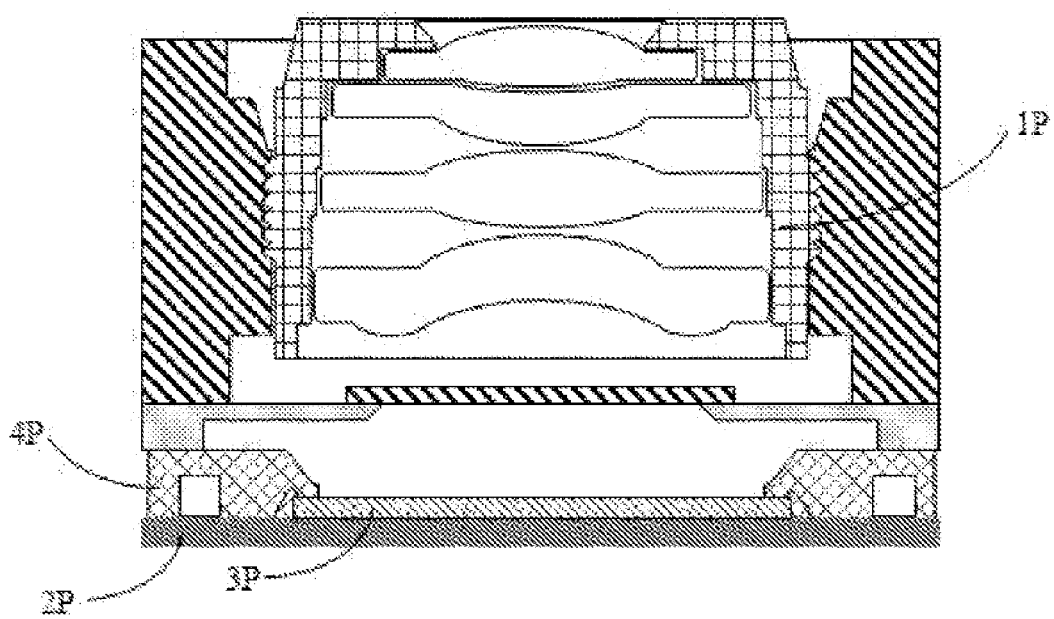
FIG. 1 illustrates a schematic structural view of an existing camera module prepared based on a molding process.
Figure 2:
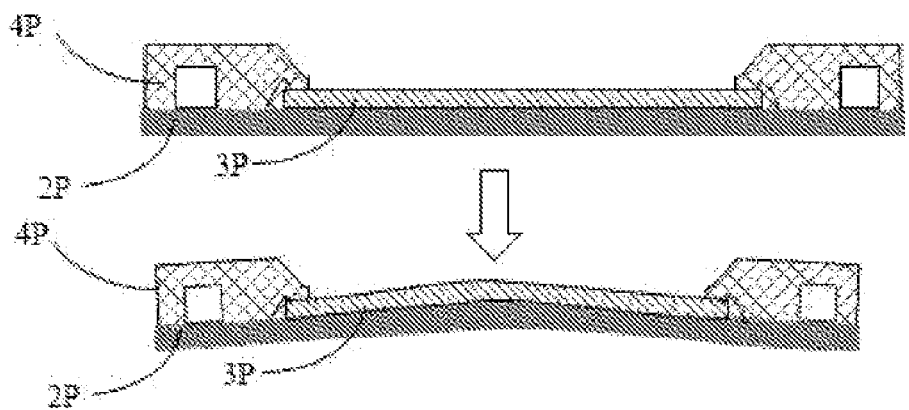
FIG. 2 illustrates a schematic view of a photosensitive chip deformed due to stress in an existing photosensitive assembly prepared based on a molding process.

Since the joining of the circuit board 2P and the molded body 4P, and the joining of the molded body 4P and the photosensitive chip 3P belong to rigid joining, stress will be generated between the circuit board 2P and the molded body 4P, and between the photosensitive chip 3P and the molded body 4P. Moreover, since the photosensitive chip 3P to has the smallest shrinkage, the stress will be concentrated on the photosensitive chip 3P, resulting in a relatively large deformation of the photosensitive chip 3P, and its deformation effect is as shown in FIG. 2. It is worth mentioning that the deformation effect shown in FIG. 2 is more exaggerated, which only shows the direction and characteristics of the deformation, and does not represent the specific deformation size. The bent photosensitive chip 3P will have a greater impact on the image quality, which is reflected in the performance of the camera module: the field curvature of the camera module is too large, and the center effect of the captured image is normal but the edge effect is poor.

At the same time, the imaging assembly formed through the molding process also have defects such as poor heat dissipation performance.

In view of the above technical problems, the basic idea of the present application is to reduce the magnitude of stress that the molded body acts on the photosensitive chip by means of the slot being disposed in the molded body, so as to effectively reduce the amount of deformation of the photosensitive chip due to the stress.

Based on this, the present application proposes a photosensitive assembly, comprising: a circuit board, a photosensitive chip electrically connected to the circuit board, at least one electronic component disposed on the circuit board, and a molded body integrally formed on the circuit board, wherein the molded body has at least one slot formed therein in a recessed manner, and the slot is located outside the photosensitive chip. In this way, the magnitude of stress that the molded body acts on the photosensitive chip is reduced by means of the slot being disposed in the molded body, so as to effectively reduce the amount of deformation of the photosensitive chip due to the stress.

After introducing the basic principles of the present application, various non-limiting embodiments of the present application will be specifically introduced below with reference to the drawings.

Exemplary Camera Module

Figure 3:
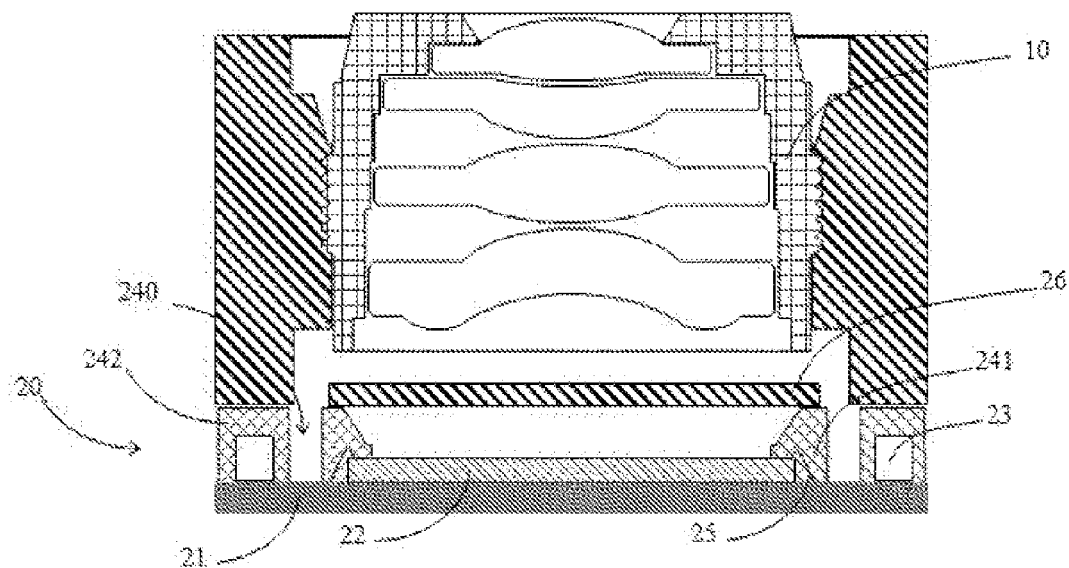
FIG. 3 illustrates a schematic view of a camera module according to an embodiment of the present application.
Figure 4:
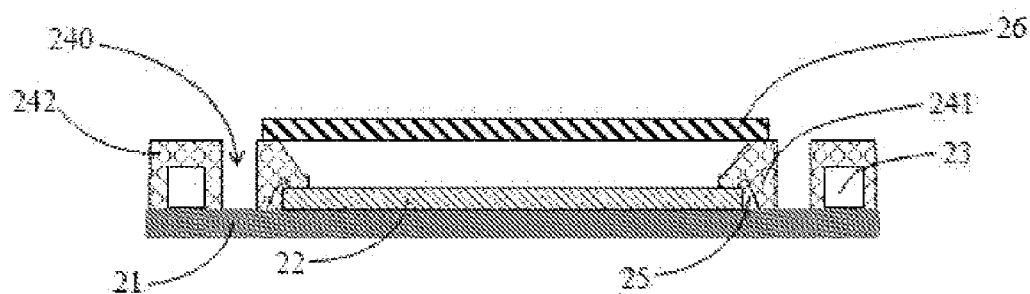
FIG. 4 illustrates a schematic view of a photosensitive assembly of the camera module according to the embodiment of the present application.
Figure 5:
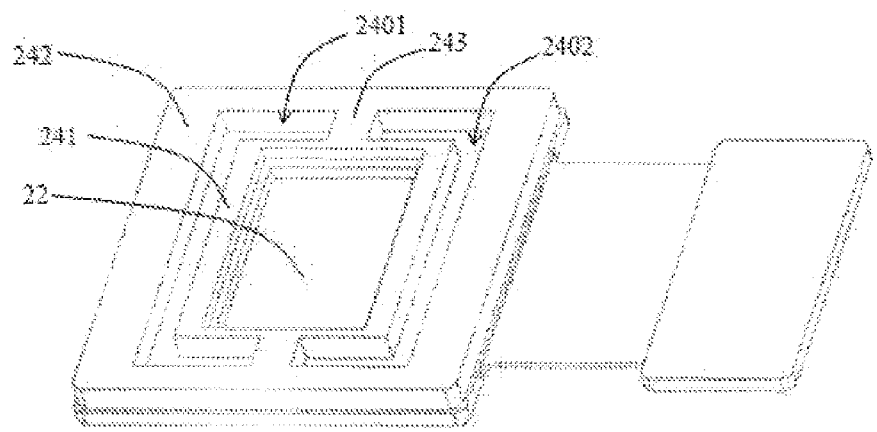
FIG. 5 illustrates another schematic view of the photosensitive assembly according to the embodiment of the present application.

As shown in FIGS. 3 to 5, a camera module based on an embodiment of the present application is illustrated, wherein the camera module includes an optical lens 10 and a photosensitive assembly 20, and the optical lens 10 is held on a photosensitive path of the photosensitive assembly 20, so that the light collected by the optical lens 10 can be imaged in the photosensitive assembly 20 along the photosensitive path. It should be noted that the camera module shown in FIG. 3 is a fixed-focus camera module. Of course, it should be known by those skilled in the art that the camera module involved in the present application can also be implemented as a dynamic-focus camera module. That is, the camera module further includes a driving element (for example, a motor) provided between the optical lens 10 and the photosensitive assembly 20, so that the driving element carries the optical lens 10 to move along the photosensitive path, so as to change the distance between the optical lens 10 and the photosensitive assembly 20.

As shown in FIG. 4, in the embodiment of the present application, the photosensitive assembly 20 includes a circuit board 21, a photosensitive chip 22, at least one electronic component 23 and a molded body 24. The photosensitive chip 22 is electrically connected to the circuit board 21. The at least one electronic component 23 is provided around the photosensitive chip 22 and is electrically connected to the circuit board 21. The molded body 24 is integrally molded on the circuit board 21 through a molding process to cover at least a part of the circuit board 21. In particular, in the embodiment of the present application, the molded body 24 is provided with a slot 240 formed therein in a recessed manner, so as to reduce the magnitude of the stress that the molded body 24 acts on the photosensitive chip 22 by means of the slot 240, thereby effectively reducing the amount of deformation of the photosensitive chip 22 due to the stress.

Specifically, in the embodiment of the present application, the at least one electronic component 23 may be mounted on an upper surface of the circuit board 21 through Surface Mounting Technology (SMT). Generally, the at least one electronic component 23 is mounted on the surrounding area of the photosensitive chip 22. Alternatively, the at least one electronic component 23 may also be pre-embedded in the circuit board 21 to reduce the height of the at least one electronic component 23 protruding from the circuit board 21. It should be understood that the mounting process of the at least one electronic component 23 is not limitative in the present application. At the same time, in the embodiment of the present application, the type of the at least one electronic component 23 is not limitative in the present application, and includes but is not limited to capacitors, inductors, triodes, thyristors, resistors, etc.

As shown in FIG. 4, in the embodiment of the present application, the electrical connection between the photosensitive chip 22 and the circuit board 21 is realized by leads 25. Specifically, in the embodiment of the present application, each of the leads 25 extends between the photosensitive chip 22 and the circuit board 21 in a bending manner, so that the photosensitive chip 22 is electrically connected to the circuit board 21 through the lead 25. Therefore, the circuit board 21 can supply power to the photosensitive chip 22 based on the leads 25, and the photosensitive chip 22 can transmit collected signals based on the leads 25. It is worth mentioning that the type of the leads 25 is not limitative in the present application. For example, the lead 25 may be a bond wire, a silver wire, or a copper wire. Moreover, the lead 25 can be mounted between the circuit board 21 and the photosensitive chip 22 through a process of "wire bonding" to achieve the electrical connection between the two.

Specifically, the "wire bonding" process is generally divided into two types: "forward wire bonding" process and "reverse wire bonding" process. The "forward wire bonding" process means that in the process of laying the lead 25, one end of the lead 25 is first formed on a conductive end of the circuit board 21, the lead 25 is then bent and extended, and finally the other end of the lead 25 is formed on the conductive end of the photosensitive chip 22. In to this way, the lead 25 is formed between the photosensitive chip 22 and the circuit board 21. The "reverse wire bonding" process means that in the process of laying the lead 25, one end of the lead 25 is first formed on the conductive end of the photosensitive chip 22, the lead 25 is then bent and extended, and finally the other end of the lead 25 is formed on the conductive end of the circuit board 21. In this way, the lead 25 is formed between the photosensitive chip 22 and the circuit board 21. It is worth mentioning that the height of the upward protrusion of the lead 25 formed through the "reverse wire bonding" process is lower than the height of the upward protrusion of the lead 25 formed through the "forward wire bonding" process. Therefore, preferably, in this specific implementation, the lead 25 is formed using the "reversed wire bonding" process.

Of course, it should be known by those skilled in the art that, in other examples of the present application, the photosensitive chip 22 and the circuit board 21 can be conducted in other ways, such as the way of back conduction. In this regard, it is not limitative in the present application.

As shown in FIG. 4, in the embodiment of the present application, the molded body 24 is integrally molded on the circuit board 21 to integrally cover at least a part of the circuit board 21, at least a part of the non-photosensitive area of the photosensitive chip 22 and at least part of the at least one electronic component 23. In particular, in the embodiment of the present application, the molded body 24 has at least one slot 240 formed therein in a recessed manner. From the perspective of the arrangement position, the slot 240 is located outside the photosensitive chip 22. By setting such a position, the slot 240 can effectively reduce the stress that the molded body 24 acts on the photosensitive chip 22, so as to effectively reduce the amount of deformation of the photosensitive chip 22 due to the stress.

Specifically, since the joining of the circuit board 21 and the molded body 24, and the joining of the molded body 24 and the photosensitive chip 22 belong to rigid joining, the joining between the photosensitive chip 22 and the circuit board 21 belong to flexible joining, and the thermal expansion coefficients of the circuit board 21, the molded body 24, and the photosensitive chip 22 are different, stress will be generated between the circuit board 21 and the molded body 24, and between the photosensitive chip 22 and the molded body 24. Moreover, since the photosensitive chip 22 has the smallest shrinkage, the stress will be concentrated on the photosensitive chip 22. Correspondingly, by providing the longitudinal slot 240 outside the photosensitive chip 22 (or between the photosensitive chip 22 and the molded body 24), the amount of stress transmitted between the molded body 24 and the photosensitive chip 22 can be reduced. Intuitively speaking, as shown in FIG. 4, by providing the longitudinal slot 240 in the molded body 24, the thickness of the molded part for transmitting stress in the molded body 24 can be reduced to reduce the magnitude of the stress that the molded body 24 acts on the photosensitive chip 22.

From the perspective of the stress transmission path, the slot 240 provided between the photosensitive chip 22 and the molded body 24 is equivalent to that the stress transmission chain between the molded body 24 and the photosensitive chip 22 is "cut" to break the stress transmission chain. More specifically, the formation position of the slot 240 may be set between the electronic component 23 and the lead 25, or between the electronic component 23 and the electronic component 23, or outside the electronic component 23. In this regard, it is not limitative in the present application. Preferably, in the embodiment of the present application, the formation position of the slot 240 is set between the electronic component 23 and the lead 25.

Figure 6A:
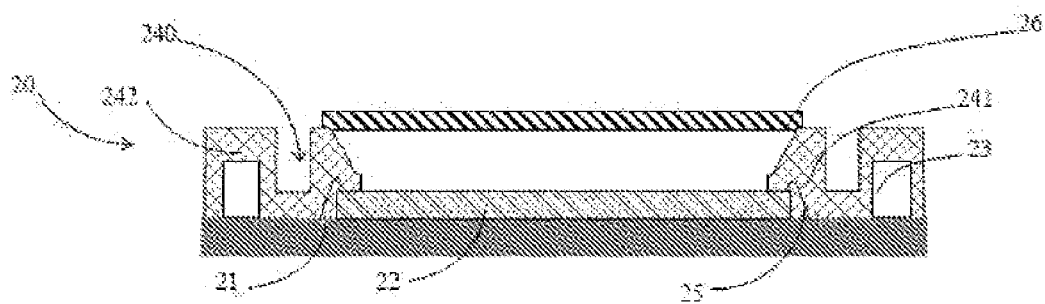
FIGS. 6A and 6B illustrate schematic views of a modified implementation of the photosensitive assembly according to the embodiment of the present application.
Figure 6B:
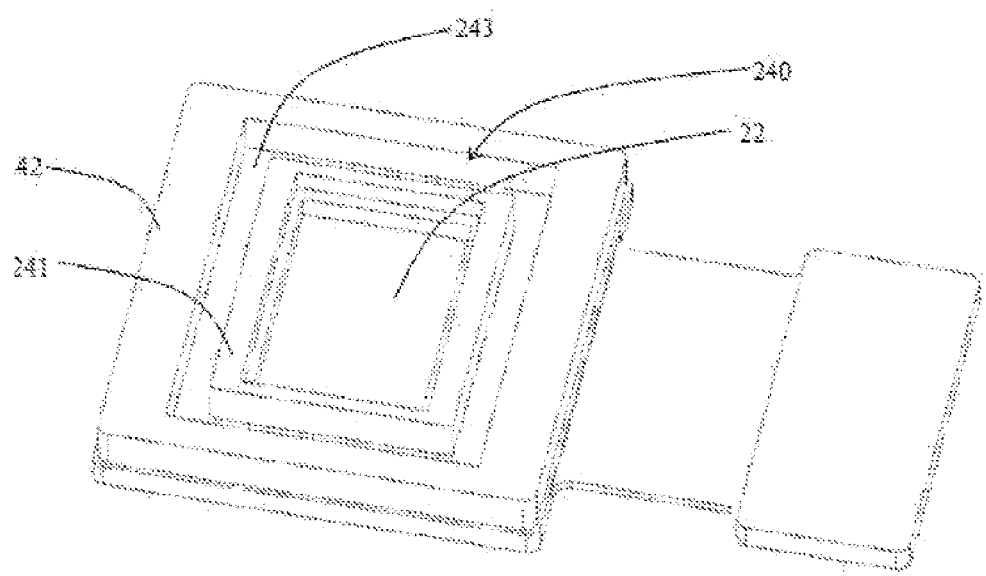

It should be understood that the ability of the slot 240 to reduce the stress that the molded body 24 acts on the photosensitive chip 22 is related to the depth of the slot 240. Specifically, as the depth of the slot 240 increases, the ability of the slot 240 to reduce the stress that the molded body 24 acts on the photosensitive chip 22 is stronger. In particular, in some examples of the present application, the depth of the slot 240 is greater than or equal to 30% of the height of the molded body 24, as shown in FIGS. 6A and 6B. Here, the height of the molded body 24 refers to the height of the molded body 24 at the position where the slot 240 is set, wherein it should be understood that the height of the molded body 24 may be different at different positions due to the shape of the molded body 24. Preferably, the depth of the slot 240 is greater than or equal to half of the height of the molded body 24.

More preferably, in the embodiment of the present application, the depth of the slot 240 is equal to the height of the molded body 24. In other words, preferably, the slot 240 is a through slot formed in the molded body 24 in a penetrating manner to expose a corresponding area of the circuit board 21. It should be understood that when the slot 240 is a through slot that penetrates through the molded body 24, the stress transmission chain between the molded body 24 and the photosensitive chip 22 is completely cut off by the slot 240, so that the stress that the molded body 24 acts on the photosensitive chip 22 is reduced to the greatest extent. It is worth mentioning that, in the embodiment of the present application, the width of the slot 240 can also be increased as much as possible without damaging the overall structural strength of the molded body 24 too much, so as to enhance the ability of the slot 240 to reduce the stress that the molded body 24 acts on the photosensitive chip 22.

As shown in FIGS. 3 to 5, when the slot 240 is formed in the molded body 24, with the slot 240 as a boundary, the molded body 24 is divided into a first molded part 241 and a second molded part 242, wherein the first molded part 241 covers at least a part of the circuit board 21 and at least a part of the non-photosensitive area of the photosensitive chip 22, and the second molded part 242 covers at least a part of the at least one electronic component 23 and at least a part of the circuit board 21.

It is worth mentioning that, in the embodiment of the present application, since the molded body 24 is divided by the slot 240 into the first molded part 241 and the second molded part 242, compared with the existing molding process, the volume of the molded part covered on the photosensitive chip 22 will be reduced, so that under the same shrinkage rate, the shrinkage of the molded part covered on the photosensitive chip 22 will be reduced. Therefore, the stress generated by the molded part is also reduced accordingly to reduce the amount of bending of the photosensitive chip 22. In particular, in the embodiment of the present application, the volume of the first molded part 241 may be smaller than that of the second molded part 242 to reduce the stress that the molded body 24 acts on the photosensitive chip 22.

In particular, as shown in FIG. 5, in the embodiment of the present application, the first molded part 241 and the second molded part 242 of the molded body 24 are connected through a molded channel 243. Specifically, as shown in FIG. 5, in the embodiment of the present application, the at least one slot 240 includes a first slot 2401 and a second slot 2402, wherein the first slot 2401 and the second slot 2402 are separately formed in the molded body 24 in a penetrating manner. In particular, the first slot 2401 and the second slot 2402 surround the first molded part 241 and are joined at the molded channel 243. That is, in the embodiment of the present application, the molded channel 243 is formed between the first slot 2401 and the second slot 2402, so that after the molded body 24 is molded, the molded body 24 is divided by the first slot 2401 and the second slot 2402 into the first molded part 241 and the second molded part 242, and the first molded part 241 and the second molded part 242 are connected through the molded channel 243. Preferably, in the embodiment of the present application, the first slot 2401 and the second slot 2402 are arranged symmetrically with respect to the center line of the photosensitive chip 22, and the first slot 2401 and the second slot 2402 has a shape of "⊏". Of course, in other examples of the embodiment of the present application, the first slot 2401 and the second slot 2402 may also be arranged in an asymmetric manner. Alternatively, when the first slot 2401 and the second slot 2402 are arranged in a symmetrical manner, the first slot 2401 and the second slot 2402 may be implemented in other shapes, such as an "I" shape. In this regard, it is not limitative in the present application.

It is worth mentioning that, in other examples of the present application, the at least one slot 240 may also include a greater number of slots 240 (for example, further include a third slot 2403), or may only include the first slot 2401 surrounding the first molded part 241. In this regard, it is not limitative in the present application.

Figure 7A:
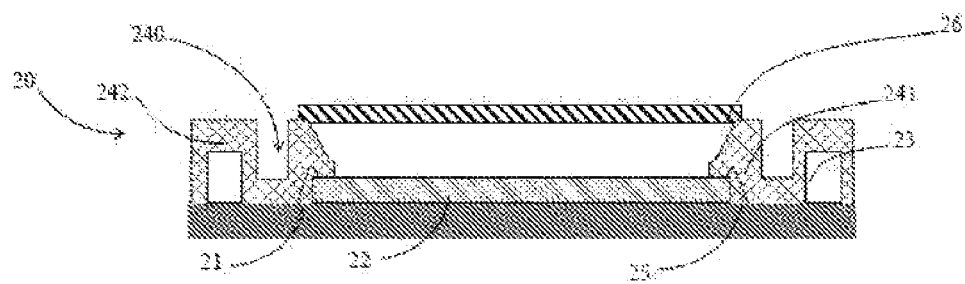
FIGS. 7A and 7B illustrate schematic views of a modified implementation of the photosensitive assembly according to the embodiment of the present application.
Figure 7B:
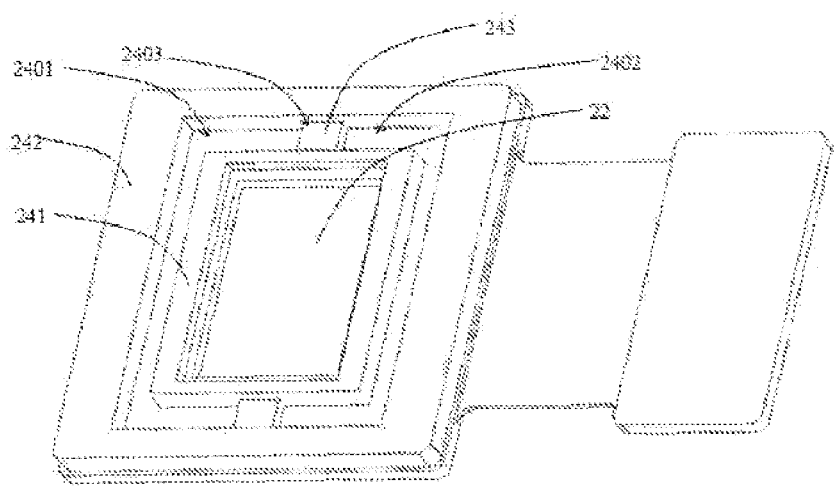

FIGS. 7A and 7B illustrate schematic views of a modified implementation of the photosensitive assembly 20 according to the embodiment of the present application. As shown in FIGS. 7A and 7B, in this modified embodiment, the first molded part 241 and the second molded part 242 of the molded body 24 are connected through a molded channel 243. In particular, in this modified embodiment, the height of the molded channel 243 is lower than that of the first molded part 241 and the second molded part 242, so that a third slot 2403 is formed between the molded channel 243, the first molded part 241 and the second molded part 242. That is to say, in this modified embodiment, the slot 240 not only includes the first slot 2401 and the second slot 2402 penetrating through the molded body 24, but also includes the third slot 2403 formed by the channel of the molded body 24, the first molded part 241 and the second molded part 242. It should be understood that the first molded part 241 and the second molded part 242 of the molded body 24 shown in FIGS. 7A and 7B can be formed through a single molding process, wherein the setting of the molded channel 243 is precisely to achieve the purpose of this process.

Figure 8A:
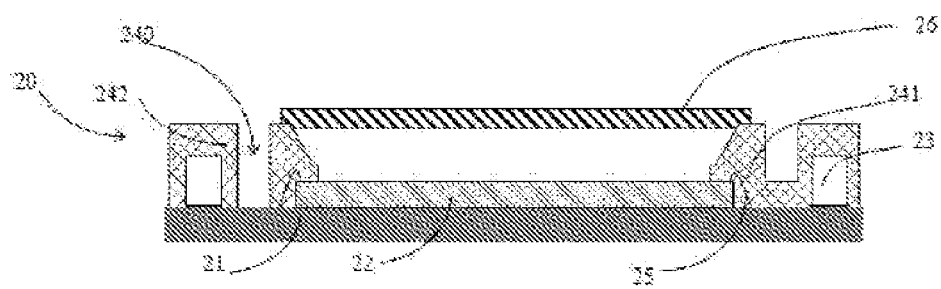
FIGS. 8A and 8B illustrate schematic views of a modified implementation of the photosensitive assembly according to the embodiment of the present application.
Figure 8B:
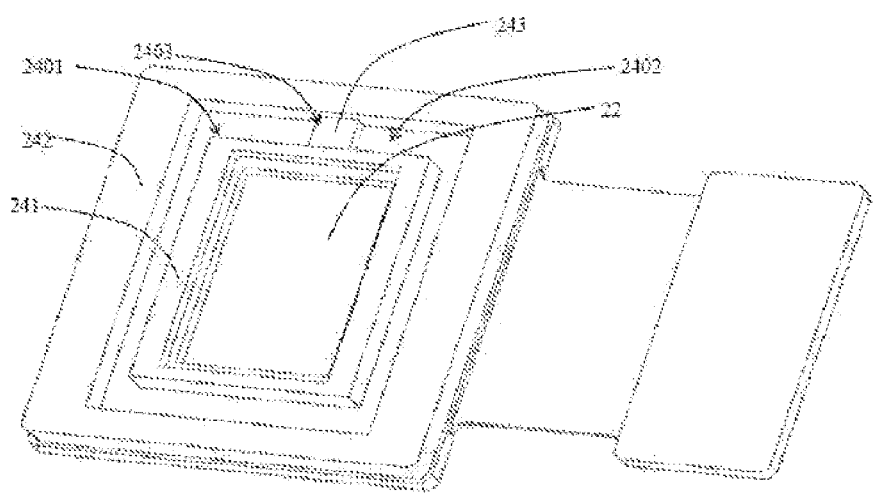

FIGS. 8A and 8B illustrate schematic views of a modified implementation of the photosensitive assembly 20 according to the embodiment of the present application. As shown in FIGS. 8A and 8B, in this modified embodiment, the first molded part 241 and the second molded part 242 of the molded body 24 are connected through the molded channel 243. In particular, in this modified embodiment, the molded body 24 includes only one molded channel 243, and the height of the molded channel 243 may be lower than or equal to that of the first molded part 241 and the second molded part 242. As shown in FIG. 8B, in the embodiment of the present application, the slot 240 has a shape of " ☐ ". It should be understood that the first molded part 241 and the second molded part 242 of the molded body 24 shown in FIGS. 8A and 8B can be formed through a single molding process, wherein the setting of the molded channel 243 is precisely to achieve the purpose of this process.

Figure 9A:
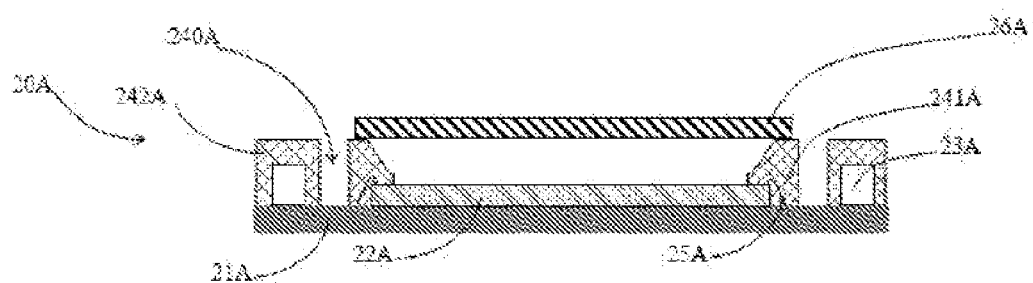
FIGS. 9A and 9B illustrate schematic views of a photosensitive assembly according to to another embodiment of the present application.
Figure 9B:
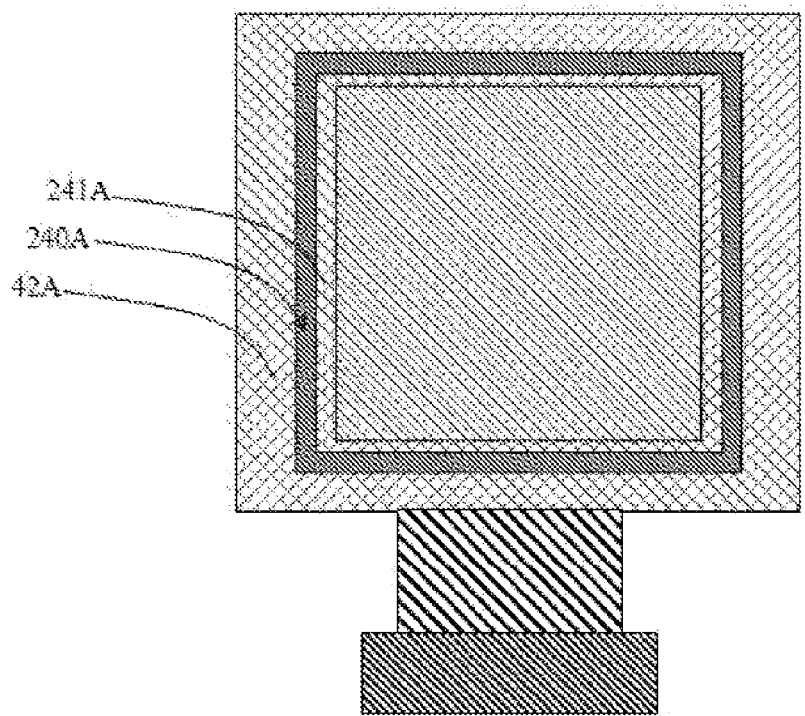

FIGS. 9A and 9B illustrate schematic views of a photosensitive assembly according to another embodiment of the present application. As shown in FIGS. 9A and 9B, compared with the photosensitive assembly 20 shown in FIG. 4, in the embodiment of the present application, the slot 240A is a closed annular slot that completely surrounds the first molded part 241A. That is to say, in the embodiment of the present application, the first molded part 241A and the second molded part 242A of the molded body 24A are divided by the slot 240A into two molded parts independent of each other. That is to say, in the embodiment of the present application, the slot 240A can completely isolate the connection between the first molded part 241A and the second molded part 242A, so that the stress generated by the second molded part 242A will not be transmitted to the first molded part 241A, and therefore will not be transmitted to the photosensitive chip 22A. In particular, in the embodiment of the present application, the first molded part 241A and the second molded part 242 are formed through two molding processes. That is to say, in the embodiment of the present application, the first molded part 241A and the second molded part 242A are separately molded in batches, and the molded body 24 shown in FIG. 4 can be molded through a single molding process. Regarding this part of the content, it will be described in more detail in the subsequent manufacturing process of the photosensitive assembly 20A, and will be skipped here.

Figure 10:
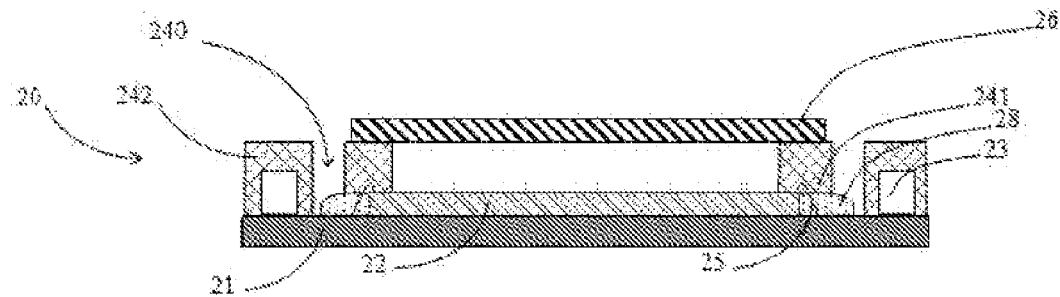
FIG. 10 illustrates a schematic view of another modified implementation of the photosensitive assembly according to the embodiment of the present application.

In order to prevent the positional deviation caused by the photosensitive chip 22 being impacted by the injected molding material during the execution of the molding process, in some examples of the embodiments of the present application, the photosensitive assembly 20 further includes a side encapsulation 28a that encloses a side part of the photosensitive chip 22 and at least a part of the lead 25. The side encapsulation 28a is used to prevent the position of the photosensitive chip 22 from shifting during the execution of the molding process, and its effect is shown in FIG. 10. It should be understood that the side encapsulation 28 can not only prevent the position of the photosensitive chip 22 from shifting, but also effectively transmit less stress generated by the molded body 24 to the photosensitive chip 22. At the same time, it can also prevent the lead 25 from collapsing by being impacted by the molding material.

Further, as shown in FIG. 4, in the embodiment of the present application, the photosensitive assembly 20 further includes a filter element 26 held in the photosensitive path of the photosensitive chip 22, wherein the filter element 26 corresponds to at least the photosensitive area of the photosensitive chip 22, and is used to filter the light entering the photosensitive chip 22 to improve the imaging quality. In particular, in the embodiment of the present application, the filter element 26 is mounted to the first molded part 241 of the molded body 24 to be maintained in the photosensitive path of the photosensitive chip 22. It is worth mentioning that when the slot 240 is provided between the electronic component 23 and the lead 25, the slot 240 is adjacent to the first molded part 241, so that the when the filter element 26 is mounted to the first molded part 241, the overflowing glue can be received in the slot 240 to prevent the excess glue from contaminating other components (especially the photosensitive chip 22). In other words, in the embodiment of the present application, the slot 240 also functions as a glue overflow slot. It should be understood that, in order to better guide the flow of glue, in some examples of the embodiments of the present application, it is also possible to further form a guide slot communicating with the slot 240 on the upper surface of the first molded part 241 in a recessed manner to guide excess glue to flow toward the slot 240.

Figure 11:
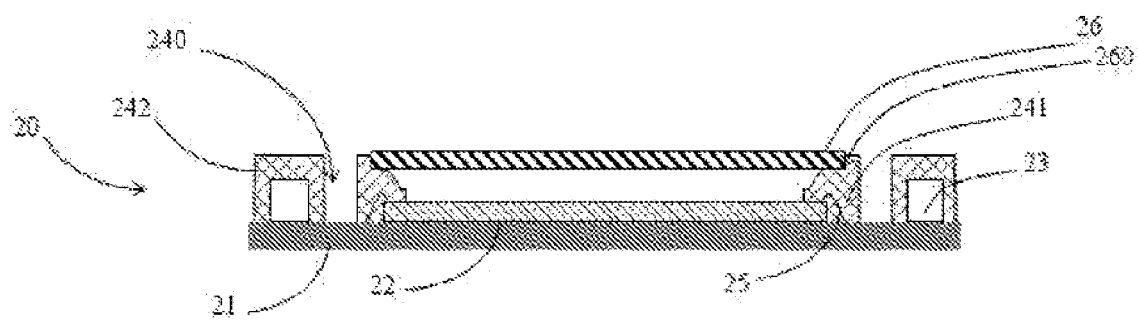
FIG. 11 illustrates a schematic view of still another modified implementation of the photosensitive assembly according to the embodiment of the present application.

In some examples of the embodiments of the present application, as shown in FIG. 11, the first molded part 241 further includes a mounting platform 260 formed on the upper surface of the first molded part 241 in a recessed manner, and the mounting platform 260 is configured to mount the filter element 26 thereon. It should be understood that, compared with directly mounting the filter element 26 on the upper surface of the first molded part 241, mounting the filter element 26 on the mounting platform 260 is advantageous to reduce the size of the filter element 26, so as to reduce the cost of the filter element 26. Moreover, this mounting method can also shorten the distance between the filter element 26 and the photosensitive chip 22, so that the overall thickness of the photosensitive assembly 20 is reduced. It is worth mentioning that, in the embodiment of the present application, the inner side of the first molded part 241 may be perpendicular to the photosensitive chip 22 or inclined to the photosensitive chip 22, wherein the inner sides arranged in different ways correspond to the parameter configurations of different protrusions of the molding mold 90. In this regard, it is not limitative in the present application.

It should be known by those skilled in the art that in the embodiments of the present application, the filter element 26 can be implemented in different types, including but not limited to the following: the filter element 26 can be implemented as an infrared cut-off filter, a full transmission spectrum filter and other filters or a combination of multiple filters. Specifically, for example, when the filter element 26 is implemented as a combination of an infrared cut-off filter and a full transmission spectrum filter, that is, the infrared cut-off filter and the full transmission spectrum filter can be switched to be selectively located in the photosensitive path of the photosensitive chip 22. In this way, when used in an environment with sufficient light such as daytime, the infrared cut-off filter can be switched to the photosensitive path of the photosensitive chip 22 to filter infrared rays in the light reflected by an object entering the photosensitive chip 22 through the infrared cut-off filter, and when used in an environment with less light such as night, the full transmission spectrum filter can be switched to the photosensitive path of the photosensitive chip 22 to allow infrared rays in the light reflected by the object entering the photosensitive chip 22 to transmit therethrough.

Figure 12:
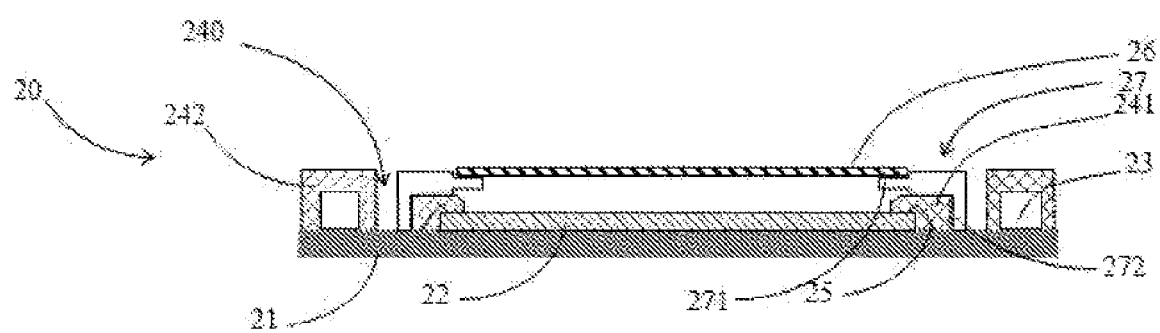
FIG. 12 illustrates a schematic view of yet another modified implementation of the photosensitive assembly according to the embodiment of the present application.

FIG. 12 illustrates a schematic view of yet another modified implementation of the photosensitive assembly 20 according to the embodiment of the present application. As shown in FIG. 12, in this modified embodiment, the photosensitive assembly 20 further includes a filter element holder 27, wherein the filter element holder 27 is disposed in the slot 240 and is configured to mount the filter element 26 thereon. Specifically, in this modified embodiment, the filter element holder 27 includes a holder body and a support arm extending inward from the holder body, wherein the support arm forms a through hole corresponding to at least the photosensitive area of the photosensitive chip 22. Correspondingly, when the filter element 26 is mounted on the support arm, the filter element 26 covers the through hole so that the light is filtered by the filter element 26 before it reaches the photosensitive chip 22 through the through hole to improve the imaging quality. It should be understood that through the support arm of the filter element holder 27, the size of the filter element 26 can be further reduced, so that the cost of the filter element 26 can be further reduced. It is worth mentioning that in other examples of the embodiments of the present application, the filter element 26 can also be held in the photosensitive path of the photosensitive chip 22 in other ways. For example, the filter element 26 can be directly stacked on the photosensitive chip 22 and participate in the molding process, so that the first molded part 241 of the molded body 24 after molding covers a part of the filter element 26 and at least a part of the circuit board 21. For another example, the filter element 26 may also be supported in the optical lens 10, or may be formed on the surface of the lens element in the optical lens 10 in the form of a coating. In this regard, it is not limitative in the present application.

Figure 13:
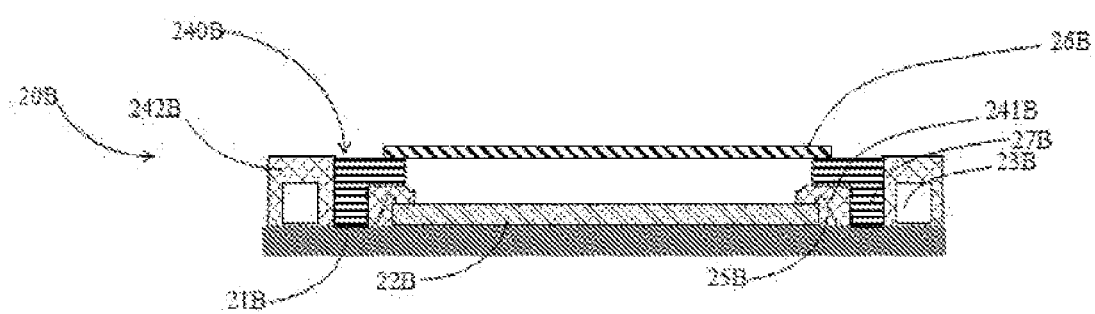
FIG. 13 illustrates a schematic view of a photosensitive assembly according to another embodiment of the present application.

FIG. 13 illustrates a schematic view of a photosensitive assembly 20 according to another embodiment of the present application. As shown in FIG. 13, in the embodiment of the present application, the filter element holder 27B is integrally joined between the first molded part 241B and the second molded part 242B of the molded body 24B. Specifically, in the embodiment of the present application, before the molding process is executed, the filter element holder 27B is disposed on the circuit board 21B, and the filter element holder 27B has a channel (not shown in the figure) penetrating therethrough, wherein the channel is configured to allow the molding material to flow through. Specifically, the channel may be provided at the bottom of the filter element holder 27B, or formed in the side wall of the filter element holder 27B in a penetrating manner. Correspondingly, after the molding material is injected into a molding mold 90B and the molded body 24B is formed, the filter element holder 27B is integrally joined between the first molded part 241B and the second molded part 241B of the molded body 24B. Regarding how the filter element 26B is joined between the first molded part 241B and the second molded part 242B, and how the molded body 24B is molded, it will be further introduced in the subsequent manufacturing process of the photosensitive assembly 20B, and will not be described in detail here.

Preferably, in this embodiment of the present application, the filter element holder 27B is made of a relatively rigid material (for example, metal, PMMA, ceramic, ABS resin, etc.), so that the filter element holder 27B has relatively high structural strength. It should be observed that after the molded body 24B is integrally formed, the inner surface of the filter element holder 27B is joined to the first molded part 241B in a covered manner, and the outer surface of the filter element 26B is integrally joined to the second molded part 242B. In this way, the filter element holder 27B can play a function of maintaining the shape of the first molded part 241B, thereby ensuring that the internal stress generated by the first molded part 241B is insufficient to excessively change the shape of the photosensitive chip 22B. Furthermore, since the filter element holder 27B is disposed between the first molded part 241B and the second molded part 242B, the stress generated by the second molded part 242B can be interrupted by the filter element holder 27B, so that the stress generated by the second molded part 242B cannot affect the photosensitive chip 22B located inside the filter element holder 27B.

That is to say, in the embodiment of the present application, the filter element holder 27B that is integrally joined to the first molded part 241B and the second molded part 242B of the molded body 24B, can not only be used to mount the filter element 26B thereon, but also can prevent the stress generated by the second molded part 242B from affecting the photosensitive chip 22B, and maintain the shape of the first molded part 241B to ensure that the internal stress generated by the first molded part 241B is insufficient to excessively change the shape of the photosensitive chip 22B.

It is worth mentioning that, as shown in FIGS. 3 to 13, the arrangement of the slot 240 can not only reduce the stress that the molded body 24 acts on the photosensitive chip 22, but also increase the overall exposed surface area of the molded body 24, so that the stress generated by the molded body 24 can be relatively more distributed to the outer surface of the molded body 24, so as to relatively reduce the magnitude of the stress that the molded body 24 acts on the photosensitive chip 22. It should be understood that the arrangement of the slot 240 increases the overall exposed surface area of the molded body 24, and the slot 240 provides a heat dissipation channel so that the heat generated by the photosensitive assembly 20 can be dissipated through the heat dissipation channel, which is advantageous to improve the heat dissipation performance of the photosensitive assembly 20. It is also worth mentioning that in the embodiment of the present application, with the consideration of the stress of the molded body 24, the slot 240 with a certain depth is formed in the molded body, and as the depth of the slot 240 increases, the heat dissipation area of the heat dissipation channel also continuously increases, so that the heat dissipation performance of the photosensitive assembly 20 can be enhanced. In particular, as mentioned above, in the embodiment of the present application, the depth of the slot 240 is greater than or equal to 30% of the height of the molded body 24.

It is also worth mentioning that the molded body 24 of the embodiment of the present application can also be molded through a compression molding process, wherein the compression molding material includes but is not limited to epoxy resin in powder or gel form, etc. In this regard, it is not limitative in the present application.

Figure 14:
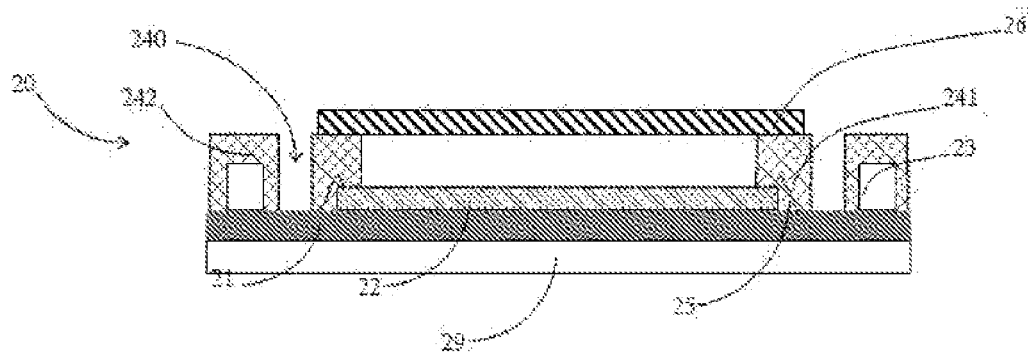
FIG. 14 illustrates a schematic view of another modified implementation according to the embodiment of the present application.

FIG. 14 illustrates another modified implementation of the photosensitive assembly 20 according to the embodiment of the present application. As shown in FIG. 14, in this modified embodiment, the photosensitive assembly 20 further includes a reinforcing plate disposed on a lower surface of the circuit board 21, so that the structural strength of the circuit board 21 can be improved through the reinforcing plate. The reason is that when the slot 240 is provided in the molded body 24, the structural strength of a partial area (exposed area) of the circuit board 21 is weakened, and the reinforcing plate can prevent the circuit board 21 from being deformed or even broken. Preferably, the reinforcing plate is made of a material with relatively high rigidity, for example metal, ceramic, ABS resin, etc.

In summary, the camera module and its photosensitive assembly based on the embodiments of the present application are set forth. They reduce the stress that the molded body acts on the photosensitive chip by means of providing the slot in the molded body to prevent the excessive deformation of the photosensitive chip due to greater stress, so as to improve the imaging quality of the camera module.

Exemplary Manufacturing Process of Optical Assembly

Figure 15:
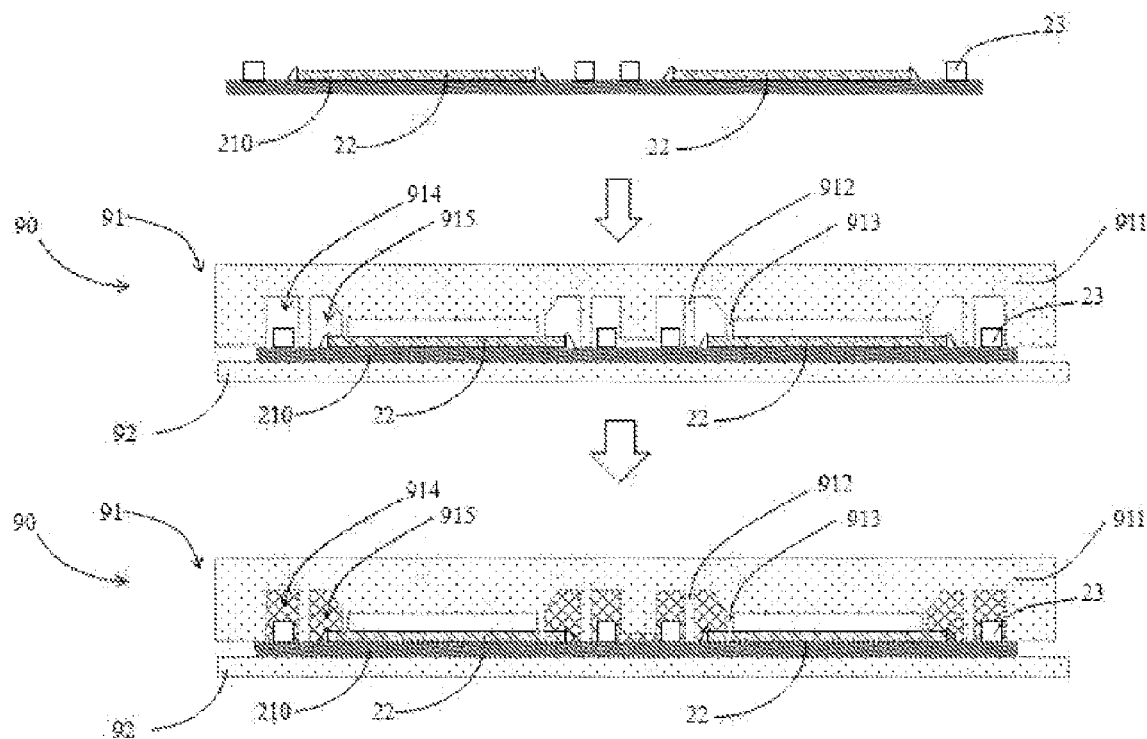
FIG. 15 illustrates a schematic view of a process for manufacturing a photosensitive assembly according to an embodiment of the present application.

FIG. 15 illustrates a schematic view of a manufacturing process of a photosensitive assembly 20 according to an embodiment of the present application, wherein the manufacturing process of the photosensitive assembly 20 illustrated in FIG. 15 is used to manufacture the photosensitive assembly 20 illustrated in FIG. 4 as an example.

As shown in FIG. 15, the manufacturing process first comprises: providing a circuit board joint panel 210, and electrically connecting at least one electronic component 23 and at least one photosensitive chip 22 to preset positions of the circuit board joint panel 210.

Further, the circuit board joint panel 210 is placed in a molding mold 90, wherein the molding mold 90 includes an upper mold 91 and a lower mold 92 matched with the upper mold 91. Specifically, in this example of the present application, the circuit board joint panel 210 is placed on the lower mold 92 of the molding mold 90, and then the upper mold 91 and the lower mold 92 are clamped so that the circuit board joint panel 210 is received in a molding space defined by the upper mold 91 and the lower mold 92.

In particular, in the embodiment of the present application, the upper mold 91 includes a mold main body 911, and first and second protrusions 912 and 913 spaced apart and extending downwardly from the mold main body 911, wherein the cross-sections of the first protrusion 912 and the second protrusion 913 have a closed annular shape, for example, a shape of "⊔". When the upper mold 91 and the lower mold 92 are clamped, the first protrusion 912 of the upper mold 91 abuts on the circuit board assembly 210, and the second protrusion 913 of the upper mold 91 abuts on the photosensitive chip 22. Specifically, the position where the first protrusion 912 abuts on the circuit board joint panel 210 is provided between the lead 25 and the electronic component 23, and the position where the second protrusion 913 abuts on the photosensitive chip 22 is provided in the non-photosensitive area of the photosensitive chip 22. In this way, a second molding space 915 is formed between the first protrusion 912 and the mold main body 911, and a first molding space 914 is formed between the second protrusion 913 and the first protrusion 912. Further, in this example of the present application, a molded channel (shown in the figure) is further provided on the first protrusion 912 for communicating the first molding space 914 and the second molding space 915.

In this way, after the molding material is injected into the molding space, the molding material gradually fills the second molding space 915 along a preset flowing channel and then fills the first molding space 914 along the molded channel (not shown in the figure). Furthermore, after curing and molding, the first molded part 241 is formed in the first molding space 914, and the second molded part 242 is formed in the second molding space 915, wherein the first molded part 241 covers at least a part of the circuit board 21 and at least a part of the non-photosensitive area of the photosensitive chip 22, and the second molded part 242 covers at least part of the at least one electronic component 23 and at least a part of the circuit board 21. Moreover, the second molded part 242 and the second molded part 242 are connected through the molded channel (not shown in the figure). Furthermore, the slot 240 is formed at a position corresponding to the first protrusion 912, that is, the first molded part 241 and the second molded part 242 form the slot 240 penetrating through the molded body 24.

After the photosensitive assembly joint panel is obtained, the photosensitive assembly joint panel is cut to obtain a plurality of individual photosensitive assemblies 20. Further, a filter element 26 is assembled on the photosensitive assembly 20 to obtain the photosensitive assembly 20 as shown in FIG. 4.

It is worth mentioning that in the embodiments of the present application, the manufacturing processes for the photosensitive assemblies 20 shown in FIGS. 6A and 6B, 7A and 7B, 8A and 8B, 10, 11, 12, and 14 are similar to the manufacturing process for that shown in FIG. 4, and those skilled in the art should easily infer the manufacturing processes thereof base on the schematic structural views of the photosensitive assemblies 20 shown in FIGS. 6A and 6B, 7A and 7B, 8A and 8B, 10, 11, 12, and 14, so they will not be repeated here.

Figure 16A:
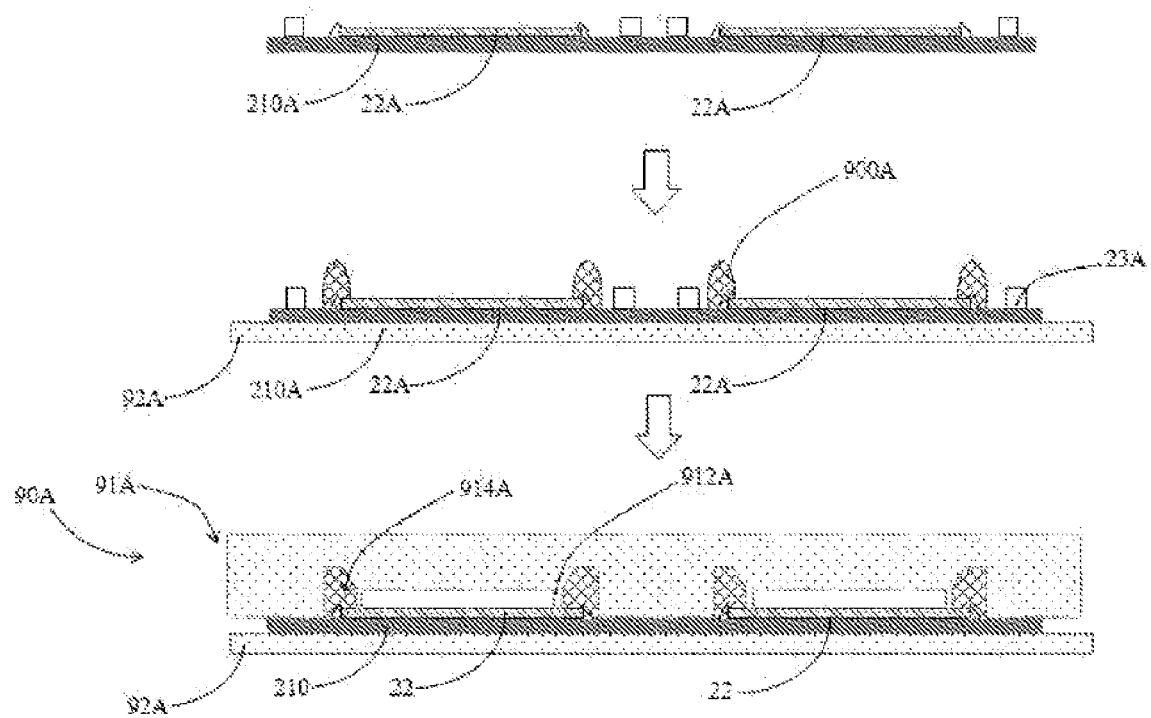
FIGS. 16A and 16B illustrate schematic views of a process for manufacturing a photosensitive assembly according to another embodiment of the present application.
Figure 16B:
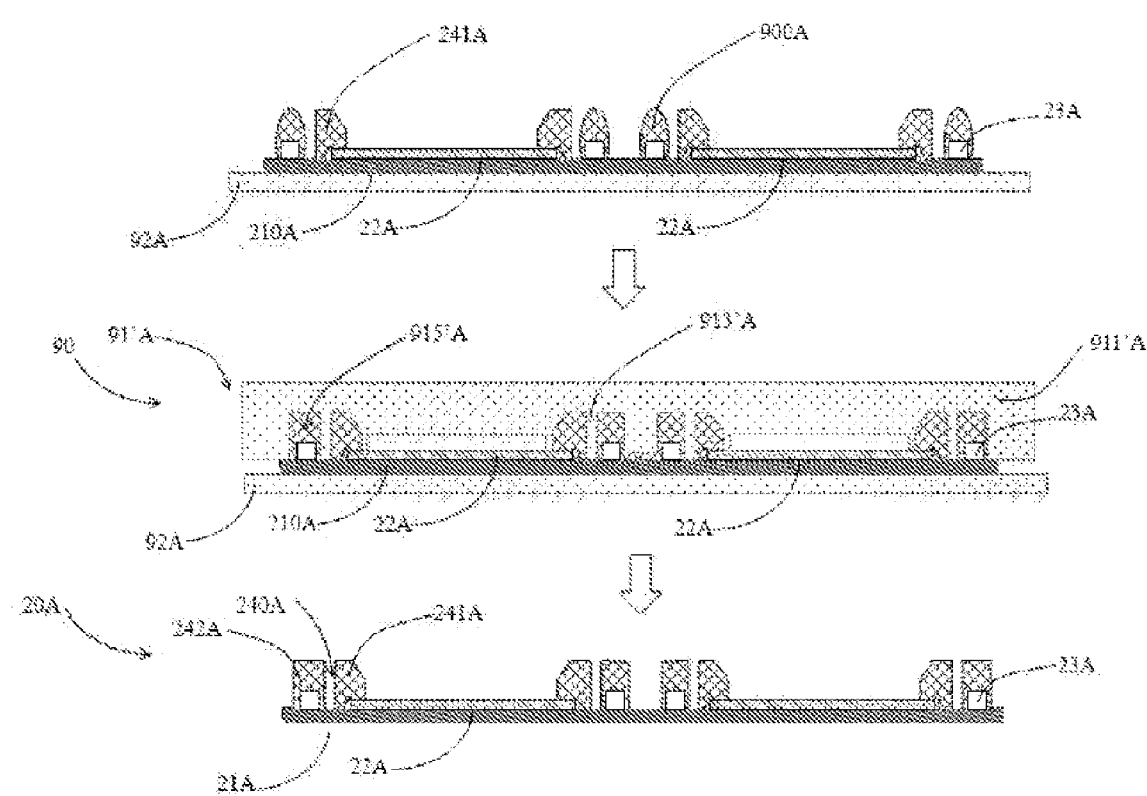

FIGS. 16A and 16B illustrate schematic views of the manufacturing process of a photosensitive assembly 20 according to an embodiment of the present application, wherein the manufacturing process of the photosensitive assembly 20 shown in FIGS. 16A and 16B is exemplified by manufacturing the photosensitive assembly 20A shown in FIGS. 9A and 9B. It is worth mentioning that the molded body 24A in the embodiment of the present application is molded through a compression molding process, wherein a compression molding material 900A includes, but is not limited to, epoxy resin in powder, gel, or granular form, etc. In this regard, it is not limitative in the present application.

As shown in FIGS. 16A and 16B, the manufacturing process first comprises: providing a circuit board joint panel 210A, and electrically connecting at least one electronic component 23A and at least one photosensitive chip 22A to preset positions of the circuit board joint panel 210A. Further, the compression molding material 900A is applied to a preset position of the circuit board joint panel 210A.

Further, the circuit board joint panel 210A is placed in a molding mold 90A, wherein the molding mold 90A includes an upper mold 91A and a lower mold 92A matched with the upper mold 91A. Specifically, in this example of the present application, the circuit board joint panel 210A is placed on the lower mold 92A of the molding mold 90A, and then the upper mold 91A and the lower mold 92A are clamped so that the circuit board joint panel 210A is received in a molding space defined by the upper mold 91A and the lower mold 92A.

In particular, in the embodiment of the present application, the upper mold 91A includes a mold main body 911A, and a first protrusions 912A spaced apart and extending downwardly from the mold main body 911A, wherein the cross-section of the first protrusion 912A have a closed annular shape, for example, a shape of "⊔". When the upper mold 91A and the lower mold 92A are clamped, the first protrusion 912A of the upper mold 91A abuts on the non-photosensitive area of the photosensitive chip 22A, so as to seal at least the photosensitive area of the photosensitive chip 22A through the first protrusion 912A and form a first molding space 914A between the first protrusion 912A and the mold main body 911A, wherein the compression molding material 900A is received in the first molding space 914A.

In this way, after the compression molding material 900A is cured and molded, the first molded part 241A is formed in the first molding space 914A, wherein the first molded part 241A covers at least a part of the circuit board 21A and at least a part of the non-photosensitive area of the photosensitive chip 22A.

Furthermore, the upper mold 91A is replaced with a second upper mold 91'A, wherein the second upper mold 91'A includes a second mold main body 911'A and a second protrusion 913'A extending downward from the second mold main body 911'A. Furthermore, the compression molding material 900A is applied to a preset position of the circuit board joint panel 210A. Furthermore, when the second upper mold 91'A and the lower mold 92A are clamped, the second protrusion 913'A of the second upper mold 91'A abuts on the circuit board assembly 210A. More exactly, the position abutting on the circuit board joint panel 210 is set between the lead 25A and the electronic component 23A. In this way, a second molding space 915'A is formed between the second protrusion 913'A and the second mold main body 911'A, wherein the molding material 900A is received in the second molding space 915'A.

In this way, after the compression molding material is cured and molded, the second molded part 242A is formed in the second molding space 915'A, wherein the second molded part 242A covers at least part of the at least one electronic component 23A and at least a part of the circuit board 21A. Furthermore, the slot 240A is formed at a position corresponding to the second protrusion 913A, that is, the first molded part 241A and the second molded part 242A form the slot 240A penetrating through the molded body 24A.

It should be understood that, in the example of the present application, in order to prepare the photosensitive assembly 20A as shown in FIG. 7, two molding processes need to be executed, and different upper molds 91A need to be replaced in the two different molding processes.

After the photosensitive assembly joint panel is obtained, the photosensitive assembly joint panel is cut to obtain a plurality of individual photosensitive assemblies 20A. Further, a filter element 26A is assembled on the photosensitive assembly 20A to obtain the photosensitive assembly 20A as shown in FIGS. 9A and 9B.

Figure 17:
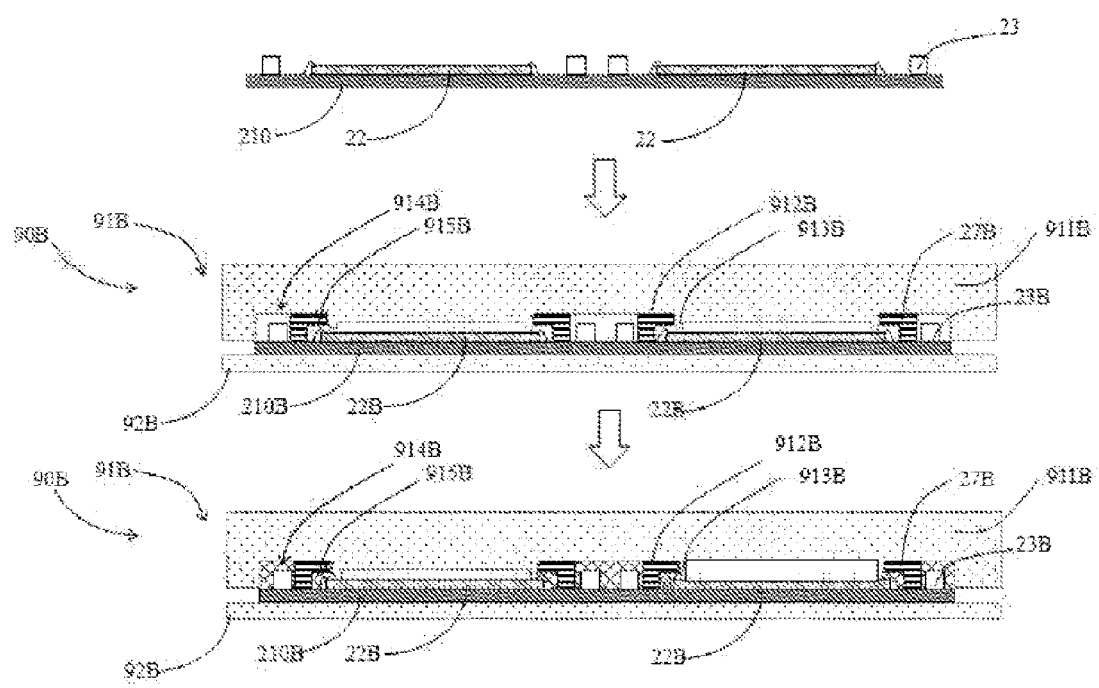
FIG. 17 illustrates a schematic view of a process for manufacturing a photosensitive assembly according to still another embodiment of the present application.

FIG. 17 illustrates a schematic view of a manufacturing process of a photosensitive assembly 20 according to an embodiment of the present application, wherein the manufacturing process of the photosensitive assembly 20 illustrated in FIG. 17 is exemplified by manufacturing the photosensitive assembly 20 illustrated in FIG. 13.

As shown in FIG. 17, the manufacturing process first comprises: providing a circuit board joint panel 210B, and electrically connecting at least one electronic component 23B and at least one photosensitive chip 22B to preset positions of the circuit board joint panel 210B.

Further, the filter element holder 27B with a channel (not shown in the figure) is provided on the circuit board joint panel 210B. Specifically, the position where the filter element holder 27B is provided on the joint panel of the filter element 26B is located outside the photosensitive chip 22B. In other words, it is between the lead 25B and the electronic component 23B.

Further, the circuit board joint panel 210B is placed in a molding mold 90B, where the molding mold 90B includes an upper mold 91B and a lower mold 92B matched with the upper mold 91B. Specifically, in this example of the present application, the circuit board joint panel 210B is placed on the lower mold 92B of the molding mold 90B, and the upper mold 91B and the lower mold 92B are then clamped so that the circuit board joint panel 210B is received in a molding space defined by the upper mold 91B and the lower mold 92B.

In particular, in the embodiment of the present application, the upper mold 91B includes a mold main body 911B, and first and second protrusions 912B and 913B spaced apart and extending downwardly from the mold main body 911B, wherein the cross-sections of the first protrusion 912B and the second protrusion 913B have a closed annular shape, for example, a shape of "□". When the upper mold 91B and the lower mold 92B are clamped, the first protrusion 912B of the upper mold 91B abuts on the filter element holder 27B, and the second protrusion 913B of the upper mold 91B abuts on the non-photosensitive area of the photosensitive chip 22B, so that a second molding space 915B is formed between the first protrusion 912B and the mold main body 911B, and a first molding space 914B is formed between the second protrusion 913B and the first protrusion 912B, wherein the first molding space 914 and the second molding space 915B communicate through the channel (not shown in the figure) provided in the filter element holder 27B.

In this way, after the molding material is injected into the molding space, the molding material gradually fills the second molding space 915B along a preset flowing channel and then fills the first molding space 914B along the channel. Furthermore, after curing and molding, the first molded part 241B is formed in the first molding space 914B, the second molded part 242B is formed in the second molding space 915B, and between the second molded part 242B and the second molded part 242B the filter element 26B is formed and integrally joined to the two, wherein the first molded part 241B covers at least a part of the circuit board 21B and at least a part of the non-photosensitive area of the photosensitive chip 22B, and the second molded part 242B covers at least a part of the at least one electronic component 23B and at least a part of the circuit board 21B.

After the photosensitive assembly joint panel is obtained, the photosensitive assembly joint panel is cut to obtain a plurality of individual photosensitive assemblies 20B. Further, a filter element 26B is assembled on the photosensitive assembly 20B to obtain the photosensitive assembly 20B as shown in FIG. 13.

It should be understood by those skilled in the art that the embodiments of the present invention described in the above description and shown in the drawings are only examples and do not limit the present invention. The objectives of the present invention have been achieved completely and efficiently. The function and structural principles of the present invention have been presented and described in the embodiments, and the implementations of the present invention may be varied or modified without departing from the principles.

The invention claimed is:

1. A photosensitive assembly, characterized in that it comprises:
   a circuit board;
   a photosensitive chip electrically connected to the circuit board; and
   a molded body integrally formed on the circuit board, wherein the molded body has at least one slot formed therein in a recessed manner, and the slot is located outside the photosensitive chip;
   wherein the slot is formed in the molded body in a penetrating manner to expose a corresponding area of the circuit board, and the slot is a closed annular slot surrounding a first molded part to divide the molded body into the first molded part and a second molded part independent of each other.

2. The photosensitive assembly according to claim 1, wherein the molded body includes the first molded part and the second molded part divided by the slot, and the first molded part covers at least a part of the circuit board and at least a part of a non-photosensitive area of the photosensitive chip.

3. The photosensitive assembly according to claim 2, further comprising at least one electronic component disposed on the circuit board, wherein the second molded part covers at least a part of the at least one electronic component and at least a part of the circuit board.

4. The photosensitive assembly according to claim 1, wherein the first molded part and the second molded part are formed through two molding processes.

5. The photosensitive assembly according to claim 1, further comprising a filter element holder disposed in the slot, wherein the filter element holder is configured to mount a filter element thereon.

6. The photosensitive assembly according to claim 5, wherein the filter element holder has a channel penetrating therethrough, and wherein the filter element holder is preset on the circuit board and integrally joined to the first molded part and the second molded part of the molded body after the molded body is integrally molded.

7. The photosensitive assembly according to claim 1, further comprising a side encapsulation that encloses a side part of the photosensitive chip and at least part of a lead for electrically connecting the photosensitive chip and the circuit board.

8. A camera module, characterized in that it comprises:
   an optical lens; and
   the photosensitive assembly according to claim 1, wherein the optical lens is held in a photosensitive path of the photosensitive assembly.

9. A method for manufacturing a photosensitive assembly, characterized in that it comprises:
   providing a circuit board, wherein at least one electronic component and at least one photosensitive chip are electrically connected to the circuit board;
   receiving the circuit board in a molding space formed when an upper mold and a lower mold of a molding mold are clamped, wherein the molding mold includes a protrusion;
   forming a molded body in the molding space; and
   separating the upper mold and the lower mold of the molding mold to form a slot recessed in the molded body at a position corresponding to the protrusion;
   wherein the slot is formed in the molded body in a penetrating manner to expose a corresponding area of the circuit board, and the slot is a closed annular slot surrounding a first molded part to divide the molded body into the first molded part and a second molded part independent of each other.

10. The method of manufacturing the photosensitive assembly according to claim 9, wherein the process of forming the molded body comprises:
   placing the circuit board in the lower mold of the molding mold;
   the upper mold and the lower mold of the molding mold being clamped, wherein the upper mold includes a mold main body and first and second protrusions spaced apart and extending downward from the mold main body, wherein when the upper mold and the lower mold are clamped, the first protrusion of the upper mold abuts on the circuit board, and the second protrusion of the upper mold abuts on a non-photosensitive area of the photosensitive chip, so as to form a second molding space between the first protrusion and the mold main body, and to form a first molding space between the second protrusion and the first protrusion, and wherein the first protrusion further has a molded channel that communicates the first molding space and the second molding space;
   filling a molding material into the first molding space and the second molding space, so as to form the first molded part in the first molding space and form the second molded part in the second molding space after the molding material is cured and molded, the first molded part and the second molded part being connected through the molded channel; and
separating the upper mold and the lower mold to form the slot at a position corresponding to the first protrusion.

11. The method of manufacturing the photosensitive assembly according to claim 9, wherein the process of forming the molded body comprises:
   applying a compression molding material on the circuit board;
   placing the circuit board in the lower mold of the molding mold;
   the upper mold and the lower mold of the molding mold being clamped, wherein the upper mold includes a mold main body and a first protrusion spaced apart and extending downward from the mold main body, wherein when the upper mold and the lower mold are clamped, the first protrusion of the upper mold abuts on the circuit board, so as to form a first molding space between the first protrusion and the mold main body, and wherein the compression molding material is located in the first molding space;
   forming the first molded part in the first molding space through a compression molding process;
   separating the upper mold and the lower mold;

applying the compression molding material on the circuit board;

the lower mold and a second upper mold of the molding mold being clamped, wherein the second upper mold includes a second mold main body and a second protrusion spaced apart and extending downward from the second mold main body, wherein when the second upper mold and the lower mold are clamped, the second protrusion of the second upper mold abuts on the circuit board, so as to form a second molding space between the second protrusion and the second mold main body, and wherein the compression molding material is located in the second molding space;

forming the second molded part in the second molding space through a compression molding process; and separating the upper mold and the lower mold to form the slot recessed in the molded body at a position corresponding to the second protrusion.

12. The method for manufacturing the photosensitive assembly according to claim 9, wherein before forming the molded body, the method further comprises:

presetting at least one filter element holder having a channel penetrating therethrough on the circuit board, so that the filter element holder is integrally joined to the first molded part and the second molded part of the molded body after the molded body is integrally molded.

13. The method for manufacturing the photosensitive assembly according to claim 9, wherein the circuit board is implemented as a circuit board joint panel.

14. A method for manufacturing a camera module, characterized in that it comprises:

forming a molded body according to the method for manufacturing the photosensitive assembly of claim 9, wherein the molded body has the slot formed therein in a recessed manner, and wherein the molded body is divided by the slot into the first molded part and the second molded part; and mounting an optical lens on the second molded part of the molded body.

* * * * *